CRYOGENIC COUPLING DEVICE

Filed Sept. 22, 1961

2 Sheets-Sheet 1

INVENTORS
NORMAN H. MEYERS
NATHANIEL ROCHESTER
EUGENE S. SCHLIG

BY Elmer Galbi[illegible]

AGENT

April 16, 1963 N. H. MEYERS ET AL 3,086,130
CRYOGENIC COUPLING DEVICE
Filed Sept. 22, 1961 2 Sheets-Sheet 2

United States Patent Office 3,086,130
Patented Apr. 16, 1963

3,086,130

CRYOGENIC COUPLING DEVICE

Norman H. Meyers, Chappaqua, Nathaniel Rochester, Mount Kisco, and Eugene S. Schlig, Ossining, N.Y., assignors to International Business Machines Corporation, New York, N.Y., a corporation of New York Filed Sept. 22, 1961, Ser. No. 140,119
7 Claims. (Cl. 307—88.5)

This invention relates to cryotronic circuitry and more particularly to a device for coupling between cryotronic circuits which are located on different substrates.

Because of fabrication difficulties, cryotronic circuits are generally deposited on relatively small substrates. These substrates do hold a substantial amount of circuitry; however, in many instances, for example in computing systems, in order to provide the desired amount of circuitry several substrates must be used. The present invention is directed at providing a device for coupling between cryotronic circuits which are located on different substrates.

Copending application Serial No. 132,961 by R. L. Garwin entitled "Transformer," filed on August 21, 1961, shows a device for coupling between cryotronic circuitry which is located on different substrates by using inductive or transforming coupling. The device which is the subject of the present invention (though somewhat similar in appearance to the device disclosed in the above application) operates on an entirely different principle than the device disclosed in the above application. The present invention does not use inductive or transformer coupling.

Cryotrons which consist of a gate which has superconductive and resistive states, and a control conductor which is positioned so that the magnetic field generated by current in the control conductor can make the gate resistive are well known. Cryotronic circuitry (i.e., circuitry which includes cryotrons) is generally deposited on substrates by vacuum deposition techniques. It is known that if cryotronic circuitry is fabricated with a superconducting plane between the cryotronic circuitry and the substrate on which it is deposited the only region wherein the magnetic field generated by current in a circuit path is appreciably strong is the region between the particular circuit path and the superconducting ground plane. Furthermore, if a superconducting plane is positioned between the circuitry and the substrate an image current flows in the superconducting ground plane beneath each circuit path. Each image current is equal in magnitude and opposite in direction to the current which produced the image current. Cryotronic circuits which have a superconducting ground plane near the circuitry have a relatively low inductance and hence they can operate at high speed. Examples of this type of circuitry are found in copending application Serial No. 625,512, filed November 30, 1956 in behalf of R. L. Garwin, and application Serial No. 824,120, filed June 30, 1959 in behalf of J. J. Lentz, and U.S. Patent 2,966,647, filed April 29, 1959 in behalf of J. J. Lentz, all of which have been assigned to the assignee of the subject invention.

Coupling between cryoelectric circuitry which is located on two different substrates can be effected by merely placing the control conductor for a cryotron on the bottom of a first substrate and the gate for the same cryotron on the top of a second substrate, neither circuitry having a superconducting plane between it and the substrate on which it is located. By bringing the control conductor into close proximity with the gate and passing sufficient current through the control conductor the magnetic field generated by the current in the control conductor causes the gate to become resistive. It has, however, been found that such an arrangement necessitates the use of an unduly large amount of current in the control conductor. Furthermore, the inductance of such circuitry is large and hence it cannot operate at high speeds.

The amount of current needed in the control conductor is slightly reduced if a first superconducting plane is placed between the first substrate and the cryotronic circuitry which includes the control conductor, and a second superconducting plane is placed between the second substrate and the cryotronic circuitry which includes the gate conductor. Such a coupling device requires a substantial amount of current in the control conductor in order to switch the gate; however, the inductance of the cryotronic circuitry which includes the control conductor and the inductance of the cryotronic circuitry which includes the gate conductor is low and, hence these circuits can operate at high speeds.

The amount of current needed in the control conductor in order to switch the gate conductor is substantially reduced if one superconducting ground plane is located between the second substrate and the cryotronic circuitry which includes the gate conductor and no superconducting ground plane is located between the first substrate and the cryotronic circuitry which includes the control conductor. The absence of a superconducting ground plane between the first substrate and the cryotronic circuitry which includes the control conductor increases the inductance of the cryotronic circuitry which includes the control conductor and severely limits the speed of such circuitry.

One feature of the present invention is directed at providing a device for coupling between low inductance cryotronic circuitry which is located on one substrate and other low inductance cryotronic circuitry which is located on a second substrate and in which a small amount of current in the control conductor causes the gate to become resistive.

In the coupling device of the present invention cryotronic circuitry which includes a cryotron gate is located on the bottom surface of a first substrate and a first superconducting ground plane is located between the first substrate and the cryotronic circuitry which includes the cryotron gate. Cryotronic circuitry which includes a control conductor is located on the top of a second substrate and a second superconducting ground plane is located between the second substrate and the cryotronic circuitry which includes a control conductor. The two substrates are positioned so that the control conductor is near the gate. At the point where the control conductor is near the gate, an aperture is cut in the superconductor ground plane which is located beneath the control conductor (i.e., in the second superconducting ground plane).

In the device of the present invention the region wherein the magnetic field generated by current in the control conductor is appreciably strong is confined to the area between the control conductor and the second superconducting ground plane everywhere except at the point where the aperture is cut in the second superconducting ground plane. At the point where the aperture is cut in the second superconducting ground plane the region of strong magnetic field generated by current in the control conductor extends above the control conductor into the area where the gate and the first superconducting ground planes are located.

For reasons which will be explained in detail later the aperture in the second superconducting ground plane causes an image current of substantial magnitude to flow above the gate in the first superconducting plane. The magnitude of this image current is equal to the current in the control conductor.

The resultant magnetic field generated by the current in the control conductor and by the image current in the first superconducting ground plane cause the gate to become resistive. The current in the control conductor and its image in the first superconducting ground plane effectively form a current loop around the gate. In this manner a relatively small amount of current in the control conductor causes the gate to become resistive. Furthermore, both the cryotronic circuitry which includes the control conductor and the cryotronic circuitry which includes the gate conductor can operate at high speed since each has a superconducting ground plane located between it and the substrate on which it is deposited.

In accordance with another feature of the invention, the invention can be used to couple between a transmission line and cryotronic circuitry which is located on a plurality of different substrates. The coupling between the transmission line and the cryotronic circuitry can be accomplished without introducing reflections into the transmission line within a certain frequency range.

It is an object of the present invention to provide a device for coupling between cryotronic circuitry which is located on different substrates.

A further object of the present invention is to provide a simple, reliable, inexpensive device for coupling between cryotronic circuitry which is located on different substrates.

A further object of the present invention is to provide a cryotronic device which couples directly from a control line which is located on one substrate to a cryotron gate which is located on a second substrate.

A further object of the present invention is to provide a cryotronic device whereby a small current in a control line on one plane can cause a gate located on another plane to become resistive.

Another object of the present invention is to provide a device consistent with the above objects which operates at a high speed.

Still another object of the present invention is to provide a device whereby the same line can be used as the control line for a plurality of cryotron gates which are located on a plurality of different substrates.

It is another object of the present invention to provide a device for coupling between a transmission line and cryotron gates located on a plurality of different substrates.

It is yet another object of the present invention to provide a device for coupling between a transmission line and cryotronic circuitry which is located on a plurality of different substrates.

It is a still further object of the present invention to provide a device for coupling between a transmission line and crytronic circuitry which is located on a plurality of different substrates without introducing reflections into the transmission line within a useful band of frequencies.

The foregoing and other objects, features and advantages of the invention will be apparent from the following more particular description of preferred embodiments of the invention, as illustrated in the accompanying drawings.

Figure 1A:
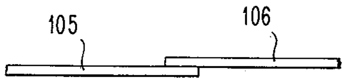
FIGURE 1A is an overall diagram of the first embodiment of the invention with the various components in their assembled positions.

In order to completely explain the various facets of the invention two different embodiments of the invention are shown and described herein. The first embodiment is shown in FIGURES 1A, 1B and 1C and the second embodiment is shown in FIGURES 2A, 2B and 2C.

The following uniform numbering scheme is used in the specification in order to facilitate reference between the specifications and the drawings. All of the reference numerals used are three digit numerals and all of the reference numerals on FIGURES 1A, 1B and 1C have a "1" in the hundreds digital position, and all of the reference numerals in FIGURES 2A, 2B and 2C have a "2" in the hundreds digital position. Hence, the reference numeral designating any component specifies the embodiment of which the component is a part.

Figure 1B:
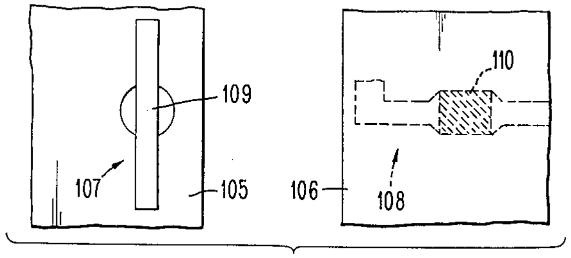
FIGURE 1B shows the substrates shown in FIGURE 1A separated so that the circuitry on the substrates can be seen.
Figure 1C:
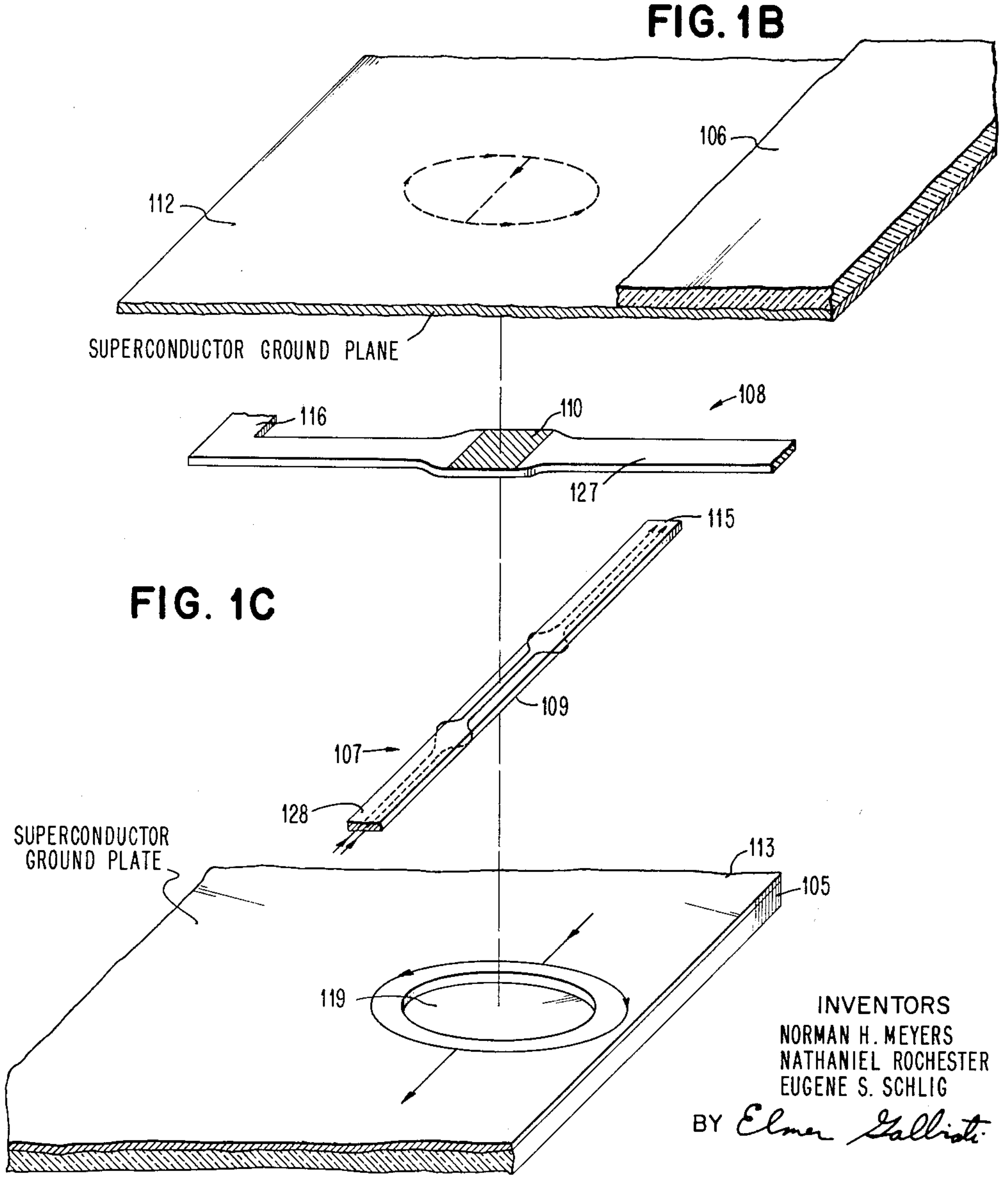
FIGURE 1C is an exploded perspective view of the first embodiment of the invention.
Figure 2A:
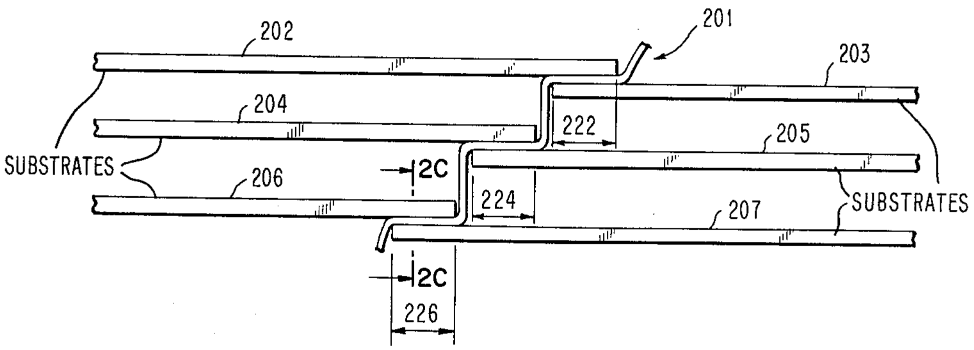
FIGURE 2A is an overall view of the second embodiment of the invention.
Figure 2B:
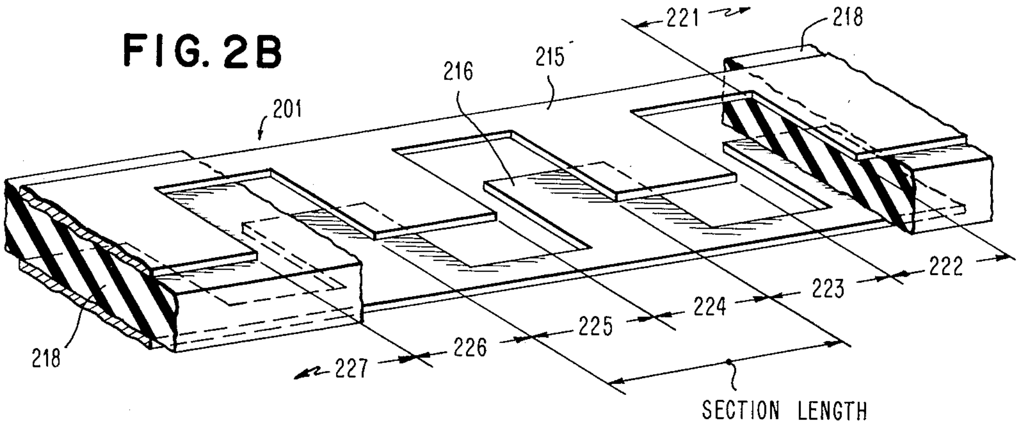
FIGURE 2B is an exploded perspective view of the transmission line shown in FIGURE 2A.
Figure 2C:
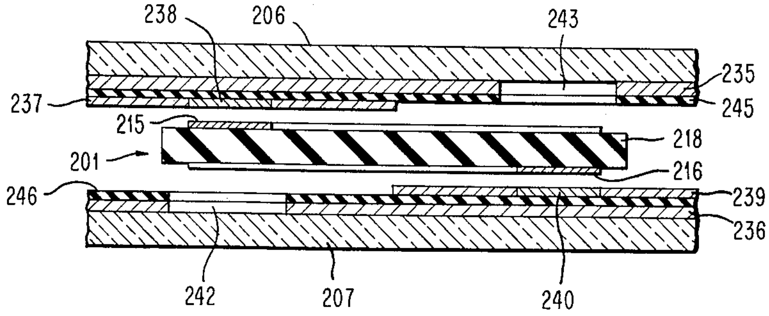
FIGURE 2C is a cross section view taken at the junction of one pair of substrates shown in FIGURE 2A.

The first embodiment of the invention which includes two substrates 105 and 106 is shown in assembled form in FIGURE 1A. Cryotronic circuitry is located on the underneath surface of substrate 106 and this circuitry is coupled to other cryotronic circuitry which is located on the top surface of substrate 105. The substrates 105 and 106 are shown separated in FIGURE 1B and cryotronic circuitry 107 and 108 which is respectively located on the top of substrate 105 and on the bottom of substrate 106 can be seen.

The cryotronic circuitry 107 includes a cryotron control conductor 109 and the cryotronic circuit 108 includes a cryotron gate 110. When the device is assembled as shown in FIGURE 1A the cryotron control 109 is located directly beneath and at a right angle to the cryotron gate 110. The first embodiment of the invention is shown in exploded perspective fashion in FIGURE 1C.

As can be seen from FIGURE 1C the cryotronic circuitry 107 and 108 is not deposited directly on substrates 105 and 106. A superconducting ground plane is first deposited on the substrates and then the circuitry is deposited on the ground planes. A superconducting ground plane 112 is located between circuitry 108 and substrate 106 and superconducting ground plane 113 is located between circuitry 107 and substrate 105. A hole or aperture 119 is cut in the superconducting ground plane 113 below the control conductor 109. Naturally, the cryotronic circuitry 107 and 108 is respectively separated from the superconducting ground planes 113 and 112 and the circuitry 107 is separated from the circuitry 108 by suitable insulating material. For the sake of clarity of illustration and since the use of such material is well known in the art, it is not shown in the drawings nor further described herein.

The particular cryotronic circuitry which is located on substrate 105 and which is connected to the control 109 is not relevant to the present invention. It is merely represented in the figures by the superconducting paths 115 and 128. Likewise the particular cryotronic circuitry which is located on substrate 106 and which is connected to gate 110 is not relevant to the present invention. It is represented in the drawings by superconducting paths 116 and 127. Cryotronic circuitry which includes gates and control lines is well known in the art.

When the device is assembled as shown in FIGURE 1A, the superconducting circuitry 107 is brought into proximity with the superconducting circuitry 108, the gate 110 being located directly above the control conductor 109 and the aperture 119. The distance between cryotronic circuitry 107 and the superconducting plane 113 and the distance between cryotronic circuitry 108 and superconducting plane 112 is fixed by the thickness of the insulation (not shown) which is located between the circuitry and the respective planes. Cryotronic circuitry 107 is also separated from cryotron circuitry 108 by a layer of insulating material (not shown). However, the distance between cryotronic circuitry 107 and cryotronic circuitry 108 is not only established by the thickness of the layer of insulating material which separates the circuits, but it is also established by the mechanical positioning of substrates 105 and 106.

The distance between cryotronic circuitry 107 and cryotronic circuitry 108 will generally be slightly more than the distance between the circuitry 107 and 108 and the respective superconducting planes 112 and 113.

The purpose of the present invention is to couple between the cryotronic circuitry 107 which is located on top of substrate 105 and cryotronic circuitry 108 which is located on the bottom of substrate 106. Current signals are applied to the control 109 through circuit 107. These signals cause gate 110 to become resistive. The increase in resistance of gate 110 is used to control cryotronic circuitry which is connected to gate 110 by current paths 116 and 127 in the usual manner well known in the cryotronic art.

Certain of the currents which flow in certain of the components is shown in FIGURE 1C with arrows. A solid arrow indicates that the particular current indicated by the arrow flows on the top surface of the particular part on which the arrow is located and a dotted arrow indicates that the current indicated by the arrow flows on the bottom surface of the particular part on which the arrow is located.

As is well known in the cryotronic art, the current in the superconducting wire attempts to flow in a section of the wire which is as close as possible to a current equal in magnitude and opposite in direction to the current flowing in the wire. The current which is equal in magnitude and opposite in direction to the current flowing in the wire is referred to as an image of the current flowing in the wire. One explanation of why the current in a superconducting wire attempts to flow as close as possible to its image current is that the current in the wire attempts to adopt a path whereby the volume of the flux between the current in the wire and the image is a minimum, and hence, so that the stored energy is a minimum.

It is also known that current in a superconducting wire generates a stronger magnetic field in the region between the current in the wire and the image of this current than in any other region. Considering the fact that it is the magnetic field generated by current in the control line that causes the gate of a cryotron to change state, it is clear that in order to operate a cryotron with a small amount of current in the control line the gate should be positioned between the control line and the image of the current which flows in the control line.

If a superconducting wire is located between two superconducting planes there is current in the two faces of the wire closest to the planes and there is an image current in each of the planes. The relative magnitude of the currents in the two faces of the wire and the relative magnitude of the two image currents depends upon the spacing of each of the superconducting planes from the wire. The magnitude of the various currents also depends on the size of the superconducting planes; however, since the size of the wire is usually very small compared to the size of the planes the planes can usually be considered to be infinitely large.

In the portions of cryotronic circuitry 107 which are not located over aperture 119 (e.g., in superconducting paths 115 and 128) some portion of the current flows on the bottom side of circuit 107 and an image of this portion of the current flows in the top surface of superconducting plane 113. The remaining portion of the current in circuit 107 flows on the top surface of circuit 107 and an image of this portion of the current flows in the bottom surface of superconducting plane 112. The relative portions of the current which flow on the top and bottom faces of circuit 107 and the relative magnitude of the image currents in planes 112 and 113 depends upon the spacing of circuit 107 from planes 112 and 113. Since (as previously described) circuitry 107 is closer to plane 113 the greater portion of the current in circuit 107 flows on the bottom surface of the circuitry 107 and the image current in plane 113 due to current in the bottom surface of circuitry 107 is greater than the image current in plane 112 due to current in the top surface of circuitry 107. However, as will now be described the above explanation does not apply to the portion of circuitry 107 which is located above aperture 119. That is, the above explanation does not apply to the current in control 109.

By cutting aperture 119 in superconducting ground plane 113 the current which normally flows on the bottom side of circuit 107 is altered in the area of the aperture (as shown by the arrows in FIGURE 1C). The current which flows on the top side of circuit 107 and its image current in superconducting ground plane 112 remains substantially unaltered (for clarity of illustration this current is not shown by arrows in FIGURE 1C). Instead of flowing on the bottom of control conductor 109 (i.e., control conductor 109 is the portion of circuit 107 which is located over aperture 119) and having an image in superconducting ground plane 113, the current normally flowing on the bottom of circuit 107 goes around the sides of circuit 107 and flows in the top of control conductor 109 and an image of this current is induced in the bottom face of superconducting ground plane 112 (i.e., in the face of superconducting plane 112 which is closest to the control conductor 109).

It should be noted that in addition to the current which normally flows on the bottom of circuitry 107 and which moves to the top of control 109 over the aperture 119 and which induces the image shown by the arrows in the face of superconducting ground plane 112 there is current which normally flows in the top surface of circutry 107 merely due to the presence of superconducting ground plane 112 and irrespective of whether aperture 119 is present. No arrows are shown in FIGURE 1C to indicate the current which normally flows in the top of circuitry 107 nor are any arrows shown in FIGURE 1C to indicate the image of this current which flows in superconducting ground plane 112.

The current which normally flows on the top surface of control 109 plus the current which is forced to the top surface of control 109 by the aperture 119 together constitute the total of the current passing through control 109 and the image current directly above control 109 in superconducting graund plane 112 has a magnitude equal to the total current passing through control 109.

The current on the top of control 109 and its image on the bottom of plane 112 effectively form a loop around the gate 110. The gate 110 is therefore located in a region which is between all of the current in control 109 and an image of all of the current in control 109. Because of this the gate can be switched to the resistive state by a relatively small amount of current in the control 109 and in cryotronic circuitry 107.

It should be noted that there is also current in circuit 108 and that an image of a portion of the current in circuit 108 flows directly above circuit 108 in superconducting ground plane 112 and an image of the remaining portions of the current in circuit 108 flows directly beneath circuit 108 in plane 113. The current in circuit 108 and its image in superconducting planes 112 and 113 is not shown in FIGURE 1C since it has no direct bearing on the present invention.

It should be particularly noted that there is no inductive coupling between the cryotronic circuit 107 and the cryotronic circuitry 108. The device of the present invention does not depend for its operation upon inductive coupling or transformer action. Instead the present invention utilizes the magnetic field generated by the current in control conductor 109 to switch the gate 110 from the superconducting state to the resistive state. This is an entirely different phenomenon from coupling by induction or by transformer action.

The gate conductor 110 and the control 109 need not be perpendicular as shown in FIGURE 1. In-line cryotrons in which the control conductor and the gate conductor are parallel are well known in the art. For example, see application Serial No. 112,373, filed by Brennemann and Meyers on May 24, 1961, entitled "Superconductive Storage Circuits." Similarly, in the present device the gate conductor and the control conductor may be parallel. If the gate and the control are parallel there will be some inductive coupling between the circuit which includes the control conductor and the circuit which includes the gate conductor; however, the device of the present invention does not depend for its operation upon this inductive coupling.

In the embodiment shown herein the aperture 119 is round; however, a round aperture is not essential to the operation of the device and the aperture may be square or any other convenient shape. The only requirement is that the aperture must be sufficiently large to encompass a substantial portion of the area beneath the gate conductor.

The cryotronic circuitry 107 and 109 is not herein shown as connected to the respective superconducting planes 112 and 113 on which the circuitry is respectively deposited. However, as is well known in the art, the superconducting planes 112 and 113 may respectively be used as the return path for the current in circuits 108 and 108. Connecting circuits 107 and 108 to the ground planes on which they are deposited would not alter the previously described current paths except in the vicinity where the connection is made. It is herein assumed that such a connection is made a substantial distance from the device of the present invention.

The specific materials from which the gate conductors, the control conductors, the other circuitry, the ground planes, and the substrates are made is not described in detail herein since the fabrication of these elements is well known in the art. Furthermore, the circuitry of the present invention requires temperatures near the absolute zero for its operation. Refrigeration devices to produce such temperatures are also well known in the art and no description thereof is given herein.

*Second Embodiment*

The second embodiment of the invention is shown in FIGURES 2A, 2B and 2C. The overall operation of the second embodiment of the invention is best understood with reference to FIGURE 2A. There are a plurality of pairs of substrates (only three pairs are shown in FIGURE 2A). The first pair of stubstrates consists of substrates 202 and 203, the second pair of substrates consists of substrates 204 and 205 and the third pair of substrates consists of substrates 206 and 207. Substrates 202, 204 and 206 have cryotronic circuitry on their lower surfaces and substrates 203, 205 and 207 have cryotronic circuitry on their top surfaces. A transmission line 201 fits between each pair of substrates and as will be explained later, the transmission line is electrically coupled to the circuitry which is on each of the substrates.

The details of the transmission line are shown in FIGURES 2B and 2C. The transmission line consists of two strips of superconducting material, 215 and 216 separated by a strip of dielectric material 218. The dielectric material 218 may be mylar tape. The transmission line 201 has four sections, 221, 223, 225, and 227 where the superconducting strips 215 and 216 are superimposed and three sections 222, 224 and 226 where the superconducting strips 215 and 216 are separated. As can be seen from FIGURE 2A, the sections of the transmisison line 201 where the superconducting strips 215 and 216 are separated are the sections of the transmission line 201 which fit between abutting substrates. For example, section 222 fits between substrates 202 and 203.

FIGURE 2C is an enlarged cross section view taken along line 2C—2C in FIGURE 2A. The details of substrates 206 and 207 and the details of the circuitry on the substrates as shown in FIGURE 2C is representative of the substrates and the circuitry on each pair of abutting substrates shown in FIGURE 2A.

As shown in FIGURE 2C substrate 206 has a superconducting ground plane 235 covering its underneath surface and substrate 207 has a superconducting ground plane 236 covering its top surface. Superconducting ground planes 235 and 236 respectively have cryotronic circuitry 237 and 239 on their surfaces. The cryotronic circuits 237 and 239 respectively include cryotron gates 238 and 240. The cryotronic circuitry 237 and 238 is respectively separated from superconducting planes 235 and 236 by two layers of insulation 245 and 246. Superconducting plane 236 and insulating layer 246 have an aperture 242 beneath cryotron gate 238 and superconducting plane 235 and insulating layer 245 have an aperture 243 above cryotron gate 240. No particular configuration of circuitry is shown on substrates 206 and 207 since the particular circuits which are on the substrates is irrelevant to the present invention. The present invention provides a device for coupling to any particular circuitry which is on the substrates (an example of circuitry which may be on the various substrates is given later). The invention merely requires that cryotron gates 238 and 240 be included in the circuitry.

The transmission line 201 is between substrate 206 and its associated substrate 207. The superconducting strip 215 is positioned directly beneath the cryotron gate 238 but separated from actual contact by a thin insulating layer (not shown) and superconducting strip 216 is positioned directly above the cryotron gate 240 but also insulated from direct contact by a thin insulating layer (not shown). Superconducting strip 215 acts as a control conductor for the cryotron gate 238 and superconducting strip 216 acts as a control conductor for the cryotron gate 240. The aperture 242 which is located below cryotron gate 238 and the aperture 243 which is located above cryotron gate 240 function in the same manner as the aperture 119 in superconducting ground plane 113 shown in FIGURE 1. That is, aperture 242 causes a large image current to flow in the superconducting ground plane 235 and aperture 243 causes a large image current to flow in the superconducting ground plane 236. The resultant magnetic field generated by current in superconducting strip 215 and its image current which flows in superconducting ground plane 235 is incident on both faces of cryotron gate 238 and the resultant magnetic field generated by the current in superconducting strip 216 and by its image current in superconducting ground plane 236 is incident upon both faces of cryotron gate 240. The manner in which the image currents are generated and the function which the image currents perform is similar to the generation and functioning of the image current generated in superconducting ground plane 112 which was previously explained with reference to the first embodiment. Hence, no further explanation of the image currents which flow in the superconducting ground planes is given herein.

A current pulse applied to the beginning of transmission line 201 propagates through the sections 221 to 227 of the transmission line 201. As the pulse passes through section 222 a cryotron gate on each of the substrates 202 and 203 is activated, when the pulse passes through section 224, a cryotron gate on each of the substrates 204 and 205 is activated, and when the pulse passes through section 226 a cryotron gate on each of the substrates 206 and 207 (i.e., cryotron gates 238 and 240) is activated.

The inductance L and the capacitance *c* of sections 222, 224 and 226 of the transmission line 201 where the strips of superconducting material 215 and 216 are separated is different from the inductance *l* and the capacitance C of the sections 221, 223, 225 and 227 where the strips of superconducting material 215 and 216 are superimposed. It should be noted that the "section length" of the line is defined as the length of a section of the line where the strips 215 and 216 are separated plus the length of a section of the line where the strips 215 and 216 are superimposed. (See FIGURE 2B.) If the section length is short in relation to the quarter wave length of desired or needed frequency components of the signal which is introduced into the transmission line the impedance of the transmission line will appear to be uniform or smooth and the desired frequency components of the signal introduced into the line will not be reflected at each place where the impedance changes. Stated differently, although the inductance and capacitance of a transmission line varies along its length, the transmission line appears to be a smooth transmissions line (i.e., a transmission line wherein the inductance and capacitance per unit length is constant) if the quarter wave length of the highest frequency component of interest in the signal applied to the transmission line is much longer than the section length of the line. At frequencies at which the transmission line appears to be smooth the impedance of the line appears to be approximately $$\sqrt{\frac{L+l}{C+c}}$$

Considering the fact that the dimensions of cryotronic circuitry are in general very small, the substrates 202 to 207 can be positioned close enough together that the section length of the transmission line 201 is such that the transmission line 201 appears to be a uniform transmission line at a substantially high frequency.

The substrates 202 to 207 are positioned by using techniques well known in the cryotronic art. Each pair of substrates is positioned one half centimeter distant from the adjacent pair of substrates and the pairs of substrates are positioned with an overlap of one half centimeter. The section length of the transmission line is approximately one centimeter. At a frequency of $10^9$ cycles per second (one kilomegacycle) a quarter wave length is about four centimeters long and even at this very high frequency a quarter wave length is still about four times the section length of the transmission line. The transmission line 201 therefore appears smooth over the band of frequencies which extends from direct current up to one kilomegacycle. Hence, it can be seen that using the device of the present invention signals of extremely high frequency can be coupled to the cryotronic circuitry location on a plurality of different substrates without any unnecessary loss of power due to reflections in the transmission line which carries signals to the circuitry on the various substrates. Naturally, the dimensions given herein are merely given as one example of an embodiment of the invention and they could be changed without departing from the spirit of the invention.

An example of the type of system wherein the second embodiment of the invention may be used is a bit organized memory system. For example, the memory might store a plurality of six bit words, the first bit for each word would be stored in cryotronic circuitry on substrate 202, the second bit of each word would be stored in cryotronic circuitry on substrate 203, the third bit of each word would be stored in cryotronic circuitry on substrate 204, the fourth bit of each word would be stored in cryotronic circuitry on substrate 205, the fifth bit of each word would be stored in cryotronic circuitry on substrate 206, and the sixth bit of each word would be stored in cryotronic circuitry on substrate 207. Each word in the memory would have associated therewith a transmission line such as transmission line 201, and each transmission line would control one cryotron gate on each substrate as does transmission line 201. The cryotron gates on the various planes which are activated by a particular transmission line would be effective to cause read out of the bits of information in the word associated with the particular transmission line. Thus, there would be one transmission line for each word in the memory, and activation of each transmission line would cause readout from one bit of information on each of the planes 202 to 207, thus reading an entire word from the memory.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A coupling device for superconducting circuitry comprising first and second substrates,
   a first superconducting ground plane on the underside of said first substrate,
   a second superconducting ground plane on the top side of said second substrate,
   a cryotron gate beneath said first superconducting ground plane (i.e., between the first superconducting ground plane and the second superconducting ground plane),
   a control conductor above said second superconducting ground plane (i.e., between the second superconducting ground plane and said cryotron gate), said control conductor being juxtaposed to said cryotron gate,
   said second superconducting ground plane having an aperture therein beneath the place where said cryotron gate is juxtaposed to said control conductor,
   whereby current in said control conductor generates an image current above said gate in said first superconducting ground plane, said image current being equal in magnitude and opposite in direction to the total current in said control conductor, the total current in said control conductor and said image current effectively forming a loop about said gate conductor whereby a relatively small amount of current in said control conductor causes said gate conductor to become resistive.

2. A cryotronic coupling device comprising,
   a cryotron gate positioned over a first superconducting ground plane on the bottom of a first substrate and and a control conductor deposited over a second superconducting ground plane on the top of a second substrate (the elements thereby being positioned in the following order: 1, first substrate, 2, first superconducting ground plane, 3, cryotro gate, 4, control conductor, 5, second superconducting ground plane, 6, second substrate),
   said control conductor being positioned to cross said gate,
   said second superconducting ground plane having an aperture at the point where the control conductor crosses the gate conductor.
   whereby current in said control conductor generates an image current in said first superconducting ground plane substantially equal in magnitude to the total current in said control conductor, said gate being positioned between the control conductor and said image current.

3. A cryotron gating device comprising,
   a first superconducting ground plane,
   a cryotron gate below said first superconducting ground plane,
   a control conductor below said cryotron gate, said control conductor being juxtaposed to said cryotron gate,
   a second superconducting ground plane located below said control conductor,
   said second ground plane having an aperture therein at the point where said control conductor is juxtaposed to said gate conductor,
   whereby current in said control conductor generates an image current above said gate in said first superconducting ground plane, said image current being equal in magnitude and opposite in direction to the total current in said control conductor, the total current in said control conductor and said image current effectively forming a loop about said gate conductor whereby a relatively small amount of current in said control conductor causes said gate conductor to become resistive.

4. In a device for coupling between cryotronic circuitry located below a first substrate and cryotronic circuitry located above a second substrate,
the cryotronic circuitry on said first substrate including a cryotron gate positioned below a first superconducting ground plane,
the cryotronic circuitry on said second substrate including a cryotron control conductor positioned above a second superconducting ground plane, said control conductor being juxtaposed to said cryotron gate,
the improvement comprising;
an aperture in said second superconducting ground plane at the place where said control conductor is juxtaposed to said gate conductor whereby an image current is generated in said first superconducting ground plane by current in said control conductor, said image current having a magnitude equal substantially to the total current in said control conductor.

5. A device for coupling to cryotronic circuitry,
a plurality of pairs of substrates each pair having a first and a second substrate, each first substrate overlapping the associated second substrate for some portion of its area,
each first substrate having a superconducting ground plane located on the undersurface thereof and a cryotron gate located beneath said superconducting ground plane,
each second substrate having a superconducting ground plane positioned on its top surface and a cryotron gate located on top of said last mentioned superconducting ground plane;
said cryotron gates being located in the area where the respective pairs of planes overlaps, each cryotron gate thereby having a first superconducting ground plane on the same substrate as it is located and a second superconducting ground plane on the opposite substrate,
a cryotronic tranmission line comprising a dielectric tape having first and second surfaces, and two strips of superconducting material respectively deposited on said first and second surfaces,
said transmission line passing between the area where each pair of substrates overlap;
said strips of superconducting material being superimposed except at the place where said transmission line passes between each pair of substrates, at the place where said transmission line passes between each pair of substrates said superconducting strips being separated, one of said superconducting strips being juxtaposed to the cryotron gate which is on each substrate of the respective pair of substrates,
said superconducting strips being juxtaposed to the respective gates and forming control conductors for the respective cryotron gates,
the superconducting plane opposite each cryotron gate having an aperture therein at the place where the strip of superconducting material is juxtaposed to the gate,
whereby current in said transmission line causes an image current in the first superconducting plane associated with each gate, said image current having a magnitude substantially equal to the total current in said transmission line, and
whereby a relatively small amount of current in said transmission line can change the state of all of said gates.

6. A cryotronic device comprising the combination of,
a transmission line which includes a strip of dielectric material, a first strip of superconducting material on top of said strip of dielectric material and a second strip of superconducting material on the bottom of said strip of dielectric material,
said strips of superconducting material having periodically superimposed sections interspersed by sections where the two superconducting strips are separated,
one pair of superconducting planes for each section of said transmission line where said first and second superconducting strips are separated, the superconducting planes in each pair of superconducting planes being disposed on the top and bottom of the associated section of the transmission line,
a plurality of cryotron gates, a first cryotron gate between the first strip of superconducting material of said transmission line and the top superconducting plane in each section where the strips of superconducting material are separated and a second cryotron gate between the second strip of superconducting material of said transmission line and the bottom superconducting plane in each section where the strips of superconducting material are separated,
each top superconducting plane having an aperture therein above each second cryotron gate and each bottom superconducting plane having an aperture therein below each first cryotron gate,
whereby current in the first strip of superconducting material produces an image current in the top superconducting plane above each first cryotron gate, and whereby current in the second strip of superconducting material produces an image current in the bottom superconducting plane below each second cryotron gate,
said image currents having a magnitude substantially equal to the total magnitude of the current in said transmission line, whereby a relatively small current in said transmission line changes the state of said gates.

7. A cryotronic device comprising the combination of,
a transmission line which includes a strip of dielectric material, a first strip of superconducting material on top of said strip of dielectric material and a second strip of superconducting material on the bottom of said strip of dielectric material,
said strips of superconducting material having periodically superimposed sections interspersed by sections where the two superconducting strips are separated, each superimposed section being one half centimeter long and each section where the strips are separated being one half centimeter long, the superimposed sections of said transmission line having an inductance of $l$ and a capacitance of C and the separated sections having an inductance of L and a capacitance of $c$.
one pair of superconducting planes for each section of said transmission line where said first and second superconducting strips are separated, the superconducting planes in each pair of superconducting planes overlapping by one half centimeter the overlapping section of each pair being disposed on the top and bottom of the associated section of the transmission line,
a plurality of cryotron gates, a first cryotron gate between the first strip of superconducting material of said transmission line and the top superconducting plane in each section where the strips of superconducting material are separated and a second cryotron gate between the second strip of superconducting material of said transmission line and the bottom superconducting plane in each section where the strip of superconducting material are separated,
each top superconducting plane having an aperture therein above each second cryotron gate and each bottom superconducting plane having an aperture therein below each first cryotron gate,
whereby current in the first strip of superconducting material produces an image current in the top superconducting plane above each first cryotron gate, whereby current in the second strip of superconducting material produces a second image current in the bottom superconducting plane below each second cryotron gate, said image currents having a magnitude substantially equal to the total magnitude of the current in said transmission line, whereby a relatively small current in said transmission line changes the state of said gates, said transmission line appearing to be a smooth line with an impedance of $$\sqrt{\frac{L+l}{C+c}}$$

to signal frequencies less than one kilomegacycle.

No references cited.